US009437618B2

(12) United States Patent
Chou

(10) Patent No.: US 9,437,618 B2
(45) Date of Patent: Sep. 6, 2016

(54) PIXEL STRUCTURE AND METHOD OF FABRICATING THE SAME
(71) Applicant: AU Optronics Corp., Hsin-Chu (TW)
(72) Inventor: Cheng-Wei Chou, Hsin-Chu (TW)
(73) Assignee: AU OPTRONICS CORP., Hsin-Chu (TW)
( * ) Notice: Subject to any disclaimer, the term of this patent is extended or adjusted under 35 U.S.C. 154(b) by 134 days.
(21) Appl. No.: 14/321,825
(22) Filed: Jul. 2, 2014
(65) Prior Publication Data
US 2015/0214248 A1 Jul. 30, 2015
(30) Foreign Application Priority Data
Jan. 29, 2014 (TW) .............................. 103103584 A
(51) Int. Cl.
H01L 27/32 (2006.01)
H01L 51/00 (2006.01)
H01L 27/12 (2006.01)
H01L 29/66 (2006.01)
(52) U.S. Cl.
CPC ....... *H01L 27/1225* (2013.01); *H01L 27/1255* (2013.01); *H01L 29/66969* (2013.01); *H01L 27/3262* (2013.01); *H01L 27/3265* (2013.01)
(58) Field of Classification Search
CPC ............. H01L 27/3276; H01L 27/124; H01L 27/3246; H01L 27/3244; H01L 27/3262
USPC .................................. 257/40, 59, 88; 438/34
See application file for complete search history.

(56) References Cited

U.S. PATENT DOCUMENTS 8,212,247 B2    7/2012  Kang
9,006,728 B2 *  4/2015  Yamazaki ......... H01L 29/41733
                                               257/43
2004/0056591 A1* 3/2004 Koo ..................... H01L 27/3244
                                               313/506
2004/0183072 A1* 9/2004 Kim .................. H01L 29/41733
                                               257/59
2005/0104814 A1* 5/2005 Choi .................... G09G 3/3233
                                               345/76
2005/0280002 A1* 12/2005 Kang ................... H01L 27/3248
                                               257/72

(Continued)

FOREIGN PATENT DOCUMENTS

CN    1716637 A    1/2006
CN    1936660 A    3/2007

(Continued)

*Primary Examiner* — David Vu
*Assistant Examiner* — Jonathan Han
(74) *Attorney, Agent, or Firm* — McClure, Qualey & Rodack, LLP

(57) ABSTRACT

A pixel structure includes a thin film transistor device. The thin film transistor device includes a first connection electrode, a second connection electrode, an oxide semiconductor channel layer, a gate insulation layer, a gate electrode, a dielectric layer, a source electrode and a drain electrode. The oxide semiconductor channel layer at least partially covers a top surface of the first connection electrode and a top surface of the second connection electrode. The gate electrode is disposed on the gate insulation layer. The dielectric layer is disposed on the gate electrode and the gate insulation layer. The gate insulation layer and the dielectric layer have a first contact hole at least partially exposing the top surface of the first connection electrode and a second contact hole at least partially exposing the top surface of the second connection electrode. The source electrode is electrically connected to the first connection electrode via the first contact hole, and the drain electrode is electrically connected to the second connection electrode via the second contact hole.

18 Claims, 13 Drawing Sheets

(56) References Cited

U.S. PATENT DOCUMENTS

| | | |
|---|---|---|
| 2006/0001091 A1 | 1/2006 | Kim |
| 2007/0064179 A1 | 3/2007 | Park |
| 2009/0267064 A1 | 10/2009 | Yano |
| 2011/0240998 A1* | 10/2011 | Morosawa ........ H01L 29/41733 257/57 |
| 2012/0286279 A1 | 11/2012 | Hsu |
| 2012/0305910 A1 | 12/2012 | Hsieh |
| 2013/0221345 A1* | 8/2013 | Ohno ................ H01L 29/78693 257/43 |
| 2014/0175399 A1* | 6/2014 | Choi ..................... H01L 27/322 257/40 |

FOREIGN PATENT DOCUMENTS

| | | |
|---|---|---|
| CN | 101312912 A | 11/2008 |
| TW | 201205800 | 2/2012 |
| TW | 201246549 | 11/2012 |
| TW | 201251026 | 12/2012 |
| TW | I425634 | 2/2014 |

* cited by examiner

PIXEL STRUCTURE AND METHOD OF FABRICATING THE SAME

BACKGROUND OF THE DISCLOSURE

1. Field of the Disclosure

The present disclosure relates to a pixel structure and method of fabricating the same, and more particularly, to a pixel structure in which source electrode/drain electrode and oxide semiconductor channel layer are electrically connected through connection electrodes, and method of fabricating the same.

2. Description of the Related Art

Thin film transistor (TFT) device is a kind of semiconductor devices commonly used in various types of display devices, such as liquid crystal display (LCD) devices, organic light-emitting diode (OLED) display devices and electronic paper (E-paper). The electron mobility of thin film transistor device is crucial to its switching rate, and thus is critical to display quality.

According to different semiconductor materials applied in the thin film transistor device, the thin film transistor devices in current display industries may include amorphous silicon thin film transistor (a-Si TFT) device, polycrystalline silicon thin film transistor (poly-Si TFT) device, and oxide semiconductor thin film transistor device. The amorphous silicon thin film transistor device is not able to satisfy requirements of foreseeable high performance display devices because of its low electron mobility. The typical value of the electron mobility of amorphous silicon thin film transistor device is smaller than 1 $cm^2/Vs$. The electron mobility of poly silicon thin film transistor device is much higher, which is about 100 $cm^2/Vs$. However, because of process issues such as high process complexity and poor uniformity, which is mainly generated by crystallization processes applied to large size substrates, the poly silicon thin film transistor device is mainly applied in small size display device. The oxide semiconductor thin film transistor device is an emerging thin film transistor device, which can be applied for large size substrate without the above-mentioned uniformity issue because oxide semiconductor material is generally amorphous crystalline. In addition, oxide semiconductor material may be formed by diverse methods such as sputter depositing, spin-on coating, and inkjet printing. The electron mobility of oxide semiconductor thin film transistor device is generally 10 times larger than the electron mobility of amorphous silicon thin film transistor device. The typical value of the electron mobility of oxide semiconductor thin film transistor device is generally between 10 and 50 $cm^2/Vs$. Therefore, the oxide semiconductor thin film transistor device is expected to fulfill the requirement of foreseeable high performance display devices.

In the oxide semiconductor thin film transistor device, the high contact resistance between the source electrode/drain electrode and the oxide semiconductor layer would reduce the efficiency regardless of its high electron mobility. Thus, it is necessary to reduce the contact resistance between the source electrode/drain electrode and the oxide semiconductor layer for the oxide semiconductor thin film transistor device.

SUMMARY OF THE DISCLOSURE

It is therefore one of the objectives of the present disclosure to provide a pixel structure and method of fabricating the same to improve the device characteristic of thin film transistor device of the pixel structure.

According to an embodiment of the present disclosure, a pixel structure is provided. The pixel structure comprises a substrate, a thin film transistor device, a first passivation layer and a first pixel electrode. The thin film transistor device is disposed on the substrate, and the thin film transistor device comprises a first connection electrode, a second connection electrode, an oxide semiconductor channel layer, a gate insulation layer, a gate electrode, a dielectric layer, a source electrode and a drain electrode. The first connection electrode and the second connection electrode are disposed on the substrate. The oxide semiconductor channel layer is disposed on the substrate, wherein the oxide semiconductor channel layer has two opposite sides partially overlapping a top surface of the first connection electrode and a top surface of the second connection electrode respectively. The gate insulation layer is disposed on the substrate and covers the oxide semiconductor channel layer, the first connection electrode and the second connection electrode. The gate electrode is disposed on the gate insulation layer. The dielectric layer is disposed on the gate electrode and the gate insulation layer, wherein the gate insulation layer and the dielectric layer have a first contact hole at least partially exposing the top surface of the first connection electrode, and a second contact hole at least partially exposing the top surface of the second connection electrode. The source electrode and the drain electrode are disposed on the dielectric layer, wherein the source electrode is electrically connected to the first connection electrode through the first contact hole, and the drain electrode is electrically connected to the second connection electrode through the second contact hole. The first passivation layer is disposed on the dielectric layer, wherein the first passivation layer has a third contact hole at least partially exposing the drain electrode. The first pixel electrode is disposed on the first passivation layer, wherein the first pixel electrode is electrically connected to the drain electrode of the thin film transistor device through the third contact hole.

According to another embodiment of the present disclosure, a method of fabricating pixel structure is provided. The method of fabricating pixel structure comprises the following steps. A substrate is provided. A first patterned conductive layer is formed on the substrate, wherein the first patterned conductive layer comprises a first connection electrode and a second connection electrode. An oxide semiconductor channel layer is formed on the substrate, wherein the oxide semiconductor channel layer has two opposite sides partially overlapping a top surface of the first connection electrode and a top surface of the second connection electrode respectively. A gate insulation layer is formed on the substrate, wherein the gate insulation layer covers the oxide semiconductor channel layer, the first connection electrode and the second connection electrode. A second patterned conductive layer is formed on the gate insulation layer, wherein the second patterned conductive layer comprises a gate electrode. A dielectric layer is formed on the gate electrode and the gate insulation layer. A first contact hole is formed in the gate insulation layer and the dielectric layer to at least partially expose the top surface of the first connection electrode, and a second contact hole is formed in the gate insulation layer and the dielectric layer to at least partially expose the top surface of the second connection electrode. A third patterned conductive layer is formed on the dielectric layer, wherein the third patterned conductive layer comprises a source electrode and a drain electrode, the source electrode is electrically connected to the first connection electrode through the first contact hole, and the drain electrode is electrically connected to the second connection electrode through the second contact hole. A first passivation layer is formed on the dielectric layer, wherein the first passivation layer has a third contact hole at least partially exposing the drain electrode. A first pixel electrode is formed on the first passivation layer, wherein the first pixel electrode is electrically connected to the drain electrode of the thin film transistor device through the third contact hole.

The pixel structure of the present disclosure uses connection electrodes to connect the source electrode/drain electrode and the oxide semiconductor channel layer, which avoids the defect of the direct contact between the source electrode/drain electrode and the oxide semiconductor channel layer. Thus, the device characteristic of the thin film transistor device is effectively improved.

These and other objectives of the present disclosure will no doubt become obvious to those of ordinary skill in the art after reading the following detailed description of the preferred embodiment that is illustrated in the various figures and drawings.

DETAILED DESCRIPTION

To provide a better understanding of the present disclosure, preferred embodiments will be made in detail. The preferred embodiments of the present disclosure are illustrated in the accompanying drawings with numbered elements.

Figure 1:
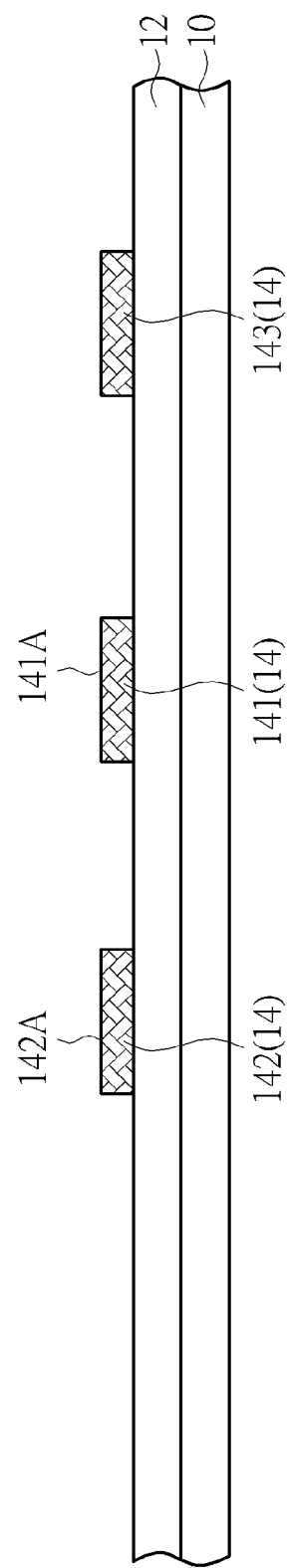
FIGS. 1-6 are schematic diagrams illustrating a method of fabricating pixel structure according to a first embodiment of the present disclosure.

Refer to FIGS. 1-6. FIGS. 1-6 are schematic diagrams illustrating a method of fabricating pixel structure according to a first embodiment of the present disclosure. As shown in FIG. 1, a substrate 10 is provided. The substrate 10 may be a transparent substrate, which may be a rigid substrate or a flexible substrate e.g. a glass substrate, a quartz substrate or a plastic substrate. Then, a buffer layer 12 may be optionally formed on the substrate 10. The buffer layer 12 is insulating, and the material of the buffer layer 12 may be inorganic insulating material e.g. silicon oxide, silicon nitride or silicon oxynitride, or organic insulating material. Also, the buffer layer 12 may be a single-layered structure or a multi-layered structure. Subsequently, a first patterned conductive layer 14 is formed on the substrate 10 or on the buffer layer 12 (if the buffer layer 12 exists). In other words, the first patterned conductive layer 14 is directly contacted with the insulating surface of the substrate 10, wherein the insulating surface of the substrate 10 optionally has the buffer layer 12. If the substrate 10 has the buffer layer 12, the insulating surface of the substrate 10 is the top surface of the buffer layer 12, and the first patterned conductive layer 14 is directly contacted with the top surface of the buffer layer 12. If the substrate 10 does not have the buffer layer 12, the insulating surface of the substrate 10 is the top surface (or namely inner surface) of the substrate 10, and the first patterned conductive layer 14 is directly contacted with the top surface (or namely inner surface) of the substrate 10. The first patterned conductive layer 14 includes a first connection electrode 141 and a second connection electrode 142, wherein the first connection electrode 141 and the second connection electrode 142 are separated and isolated from each other, so the first connection electrode 141 is not contacted with the second connection electrode 142. The resistance of the first patterned conductive layer 14 is, for example, substantially less than $20\Omega/\square$ (20 $\Omega$/square), but not limited thereto. The material of the first patterned conductive layer 14 may include metal oxide conductive material e.g. indium tin oxide (ITO), indium zinc oxide (IZO), aluminum zinc oxide (AZO), aluminum indium oxide (AIO), indium oxide (InO), gallium oxide (GaO) or other suitable metal oxide conductive material, metal material e.g. molybdenum (Mo), titanium (Ti) or other suitable metal materials, metal alloy e.g. molybdenum nitride (MoN), a combination of the aforementioned materials, or other conductive materials with low resistance. In addition, the first patterned conductive layer 14 may be a single-layered structure or a multi-layered structure which includes one or more conductive materials. In other words, the first connection electrode 141 and the second connection electrode 142 may be metal oxide conductive electrodes, metal electrodes or other conductive electrodes with low resistance. In this embodiment, the first patterned conductive layer 14 may further include a storage capacitor bottom electrode 143, wherein the storage capacitor bottom electrode 143 is optionally separated and isolated from at least one of the first connection electrode 141 and the second connection electrode 142.

Figure 2:
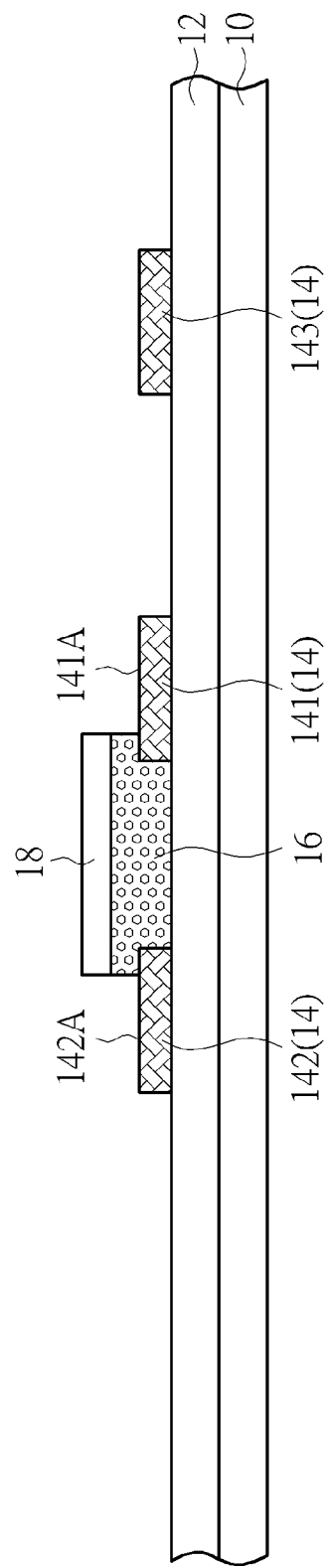

As shown in FIG. 2, an oxide semiconductor channel layer 16 is formed on the substrate 10, and two opposite sides of the oxide semiconductor channel layer 16 partially overlap a top surface 141A of the first connection electrode 141 and a top surface 142A of the second connection electrode 142 respectively, and partially expose the top surface 141A of the first connection electrode 141 and the top surface 142A of the second connection electrode 142 respectively. In other words, the bottom surface of the oxide semiconductor channel layer 16 is covered with a portion of the top surface 141A of the first connection electrode 141, the side surface of the first connection electrode 141, a portion of the top surface 142A of the second connection electrode 142, the side surface of the second connection electrode 142 and the space between the side surface of the first connection electrode 141 and the side surface of the second connection electrode 142, wherein the side surface of the oxide semiconductor channel layer 16 is connected to the bottom surface of the oxide semiconductor channel layer 16, and the side surface of the oxide semiconductor channel layer 16 is located at the top surface 141A of the first connection electrode 141 and the top surface 142A of the second connection electrode 142, respectively. The thickness of the oxide semiconductor channel layer 16 is, for example, ranging from about 200 angstroms (A) to 1000 angstroms, but not limited thereto. The material of the oxide semiconductor channel layer 16 may include, for example, indium gallium zinc oxide (IGZO), indium gallium oxide (IGO), indium zinc oxide (IZO), indium tin oxide (ITO), zinc oxide (ZnO), indium oxide (InO), indium tin zinc oxide (ITZO), gallium oxide (Ga) or other suitable oxide semiconductor materials. The oxide semiconductor channel layer 16 may have amorphous structure, and may be formed by sputter depositing, spin-on coating, inkjet printing or other suitable processes. The thickness of the oxide semiconductor channel layer 16 may be, for example, ranging from about 50 angstroms to 1000 angstroms and preferably from about 200 angstroms to 500 angstroms, but not limited thereto. In addition, the oxide semiconductor channel layer 16 may be a single-layered structure or a multi-layered structure which includes one or more oxide semiconductor materials. When the oxide semiconductor channel layer 16 is thicker, the resistance is lower, but the step coverage is worse. Within the aforementioned range, the overlapping part between the oxide semiconductor channel layer 16 and the first connection electrode 141/the second connection electrode 142 has better step coverage. In this embodiment, a protection pattern 18 may be optionally formed on and protect the oxide semiconductor channel layer 16. The material of the protection pattern 18 may be insulating, which may be inorganic insulating material e.g. silicon oxide, silicon nitride or silicon oxynitride, or organic insulating material. In addition, the protection pattern 18 and the oxide semiconductor channel layer 16 are preferably formed by the same patterning process, and thus no extra patterning process is required. Specifically, the protection pattern 18 and the oxide semiconductor channel layer 16 have the same periphery, i.e. the vertical projection area of the protection pattern 18 is substantially equal to that of the oxide semiconductor channel layer 16, but not limited thereto.

Figure 3:
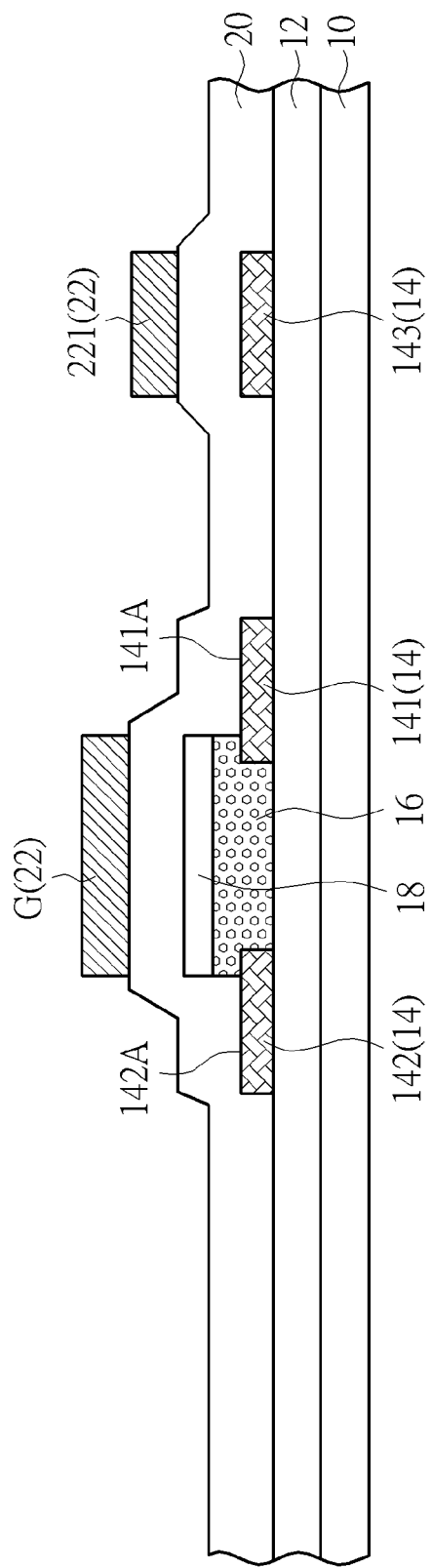

As shown in FIG. 3, a gate insulation layer 20 is formed on the substrate 10. The gate insulation layer 20 covers the oxide semiconductor channel layer 16, the first connection electrode 141 and the second connection electrode 142. The gate insulation layer 20 may cover the protection pattern 18 (if the protection pattern 18 exists). The material of the gate insulation layer 20 may be inorganic insulating material e.g. silicon oxide, silicon nitride or silicon oxynitride, or organic insulating material. The gate insulation layer 20 may be a single-layered structure or a multi-layered structure. Then, a second patterned conductive layer 22 is formed on the gate insulation layer 20. The second patterned conductive layer 22 includes a gate electrode G, substantially corresponding to the oxide semiconductor channel layer 16. The material of the second patterned conductive layer 22 may include transparent conductive material e.g. ITO, metal e.g. aluminum (Al), titanium/aluminum/titanium (Ti/Ai/Ti), molybdenum (Mo), molybdenum/aluminum/molybdenum (Mo/Ai/Mo), alloy of the aforementioned material, other suitable metal or alloy. The second pattern conductive layer 22 may be a single-layered structure or a multi-layered structure. In this embodiment, the second patterned conductive layer 22 may further include a storage capacitor top electrode 221. The storage capacitor top electrode 221 at least partially overlaps the storage capacitor bottom electrode 143 of the first patterned conductive layer 14 in the vertical projection direction, and the storage capacitor top electrode 221, the storage capacitor bottom electrode 143 and the gate insulation layer 20 interposed therebetween form a storage capacitor device Cst. In addition, the storage capacitor top electrode 221 is optionally separated and isolated from the gate electrode G.

Figure 4:
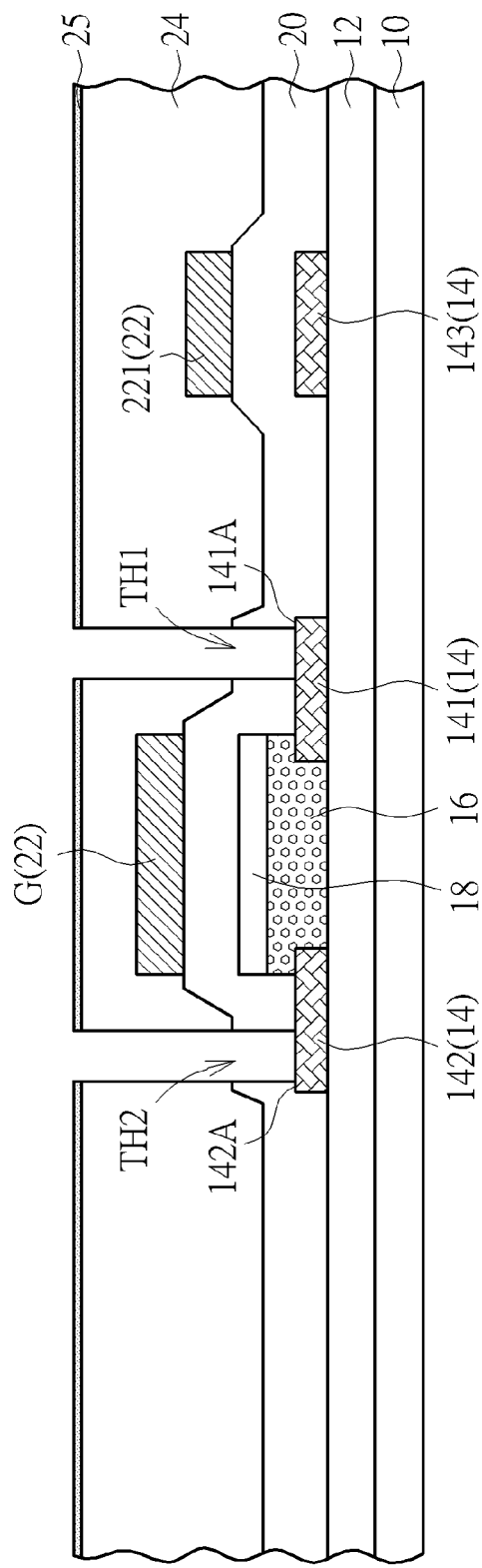

As shown in FIG. 4, a dielectric layer 24 is formed on the gate electrode G and the gate insulation layer 20, and a first contact hole (namely through hole or via hole) TH1 is formed in the gate insulation layer 20 and the dielectric layer 24 to at least partially expose the top surface 141A of the first connection electrode 141, and a second contact hole TH2 is formed in the gate insulation layer 20 and the dielectric layer 24 to at least partially expose the top surface 142A of the second connection electrode 142. In addition, the dielectric layer 24 further covers the storage capacitor top electrode 221. The dielectric layer 24 may have an even surface for the sake of formation of successive films. The material of the dielectric layer 24 may be organic dielectric material or inorganic dielectric material, and the dielectric layer 24 may be a single-layered structure or a multi-layered structure. In this embodiment, a first protection film 25 may be optionally formed on the dielectric layer 24. The first protection film 25 is insulating, and the material of the first protection film 25 may be, for instance, aluminum oxide (AlOx), but not limited thereto. The first protection film 25 and the dielectric layer 24 may be formed by the same patterning process, and thus no extra patterning process is required.

Figure 5:
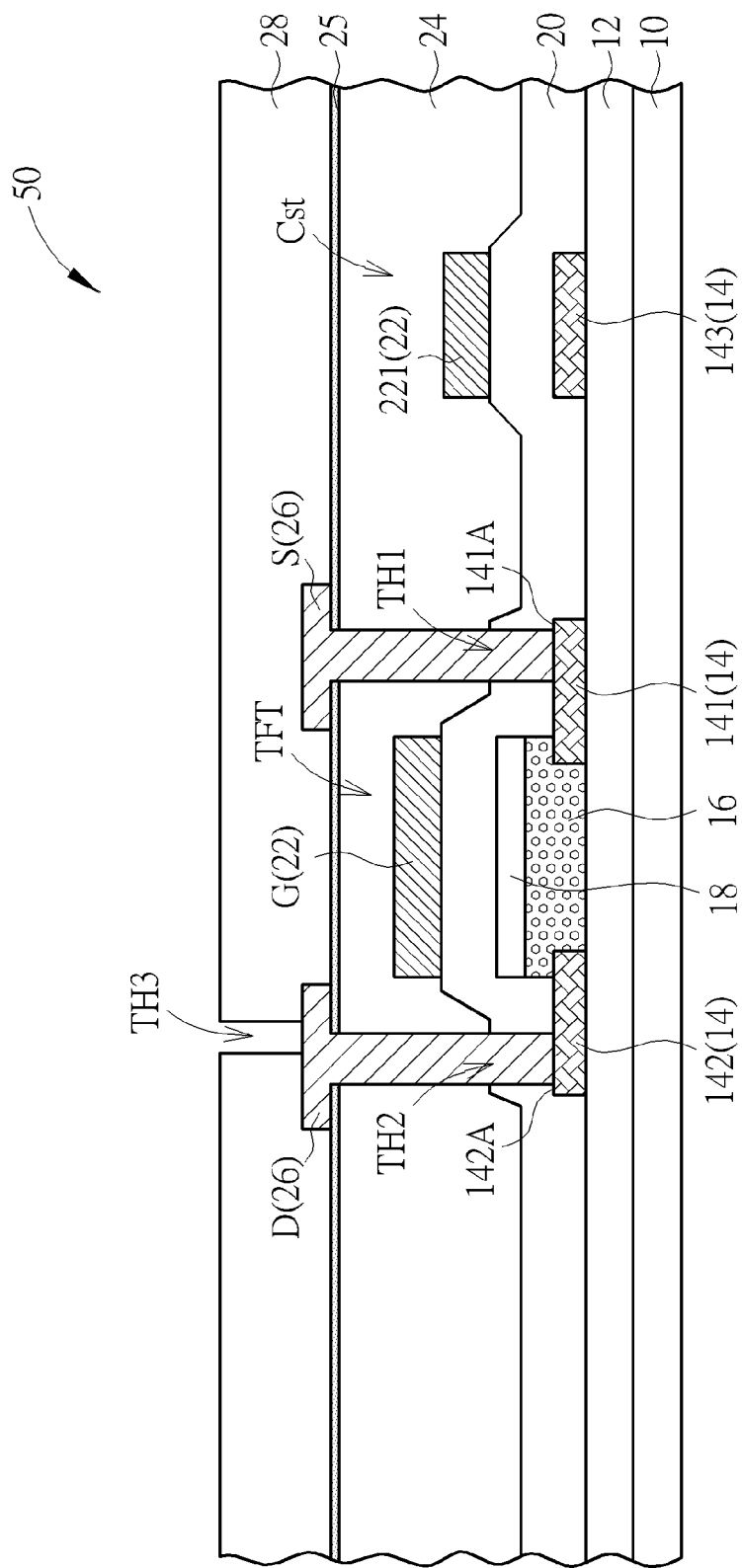

As shown in FIG. 5, a third patterned conductive layer 26 is formed on the dielectric layer 24. The third patterned conductive layer 26 includes a source electrode S and a drain electrode D, where the source electrode S is in contact with and electrically connected to the first connection electrode 141 through the first contact hole TH1, and the drain electrode D is in contact with and electrically connected to the second connection electrode 142 through the second contact hole TH2, wherein the source electrode S and the drain electrode D are separated and isolated from each other, so the source electrode S is not contacted with the drain electrode D. The gate electrode G, the oxide semiconductor channel layer 16, the gate insulation layer 20, the source electrode S and the drain electrode D form a thin film transistor device TFT. The drain electrode D and the second connection electrode 142 are both part of an entire drain electrode, and the second connection electrode 142 may be regarded as an extension part of the drain electrode D; the source electrode S and the first connection electrode 141 are both part of an entire source electrode, and the first connection electrode 141 may be regarded as an extension part of the source electrode S. The drain electrode D and the source electrode S are not in physical contact with the oxide semiconductor channel layer 16. The material of the third patterned conductive layer 26 may include transparent conductive material e.g. ITO, non-transparent conductive material including metal e.g. aluminum (Al), titanium/aluminum/titanium (Ti/Ai/Ti), molybdenum (Mo), molybdenum/aluminum/molybdenum (Mo/Ai/Mo), alloy of the aforementioned material, other suitable metal or alloy. The third patterned conductive layer 26 may be a single-layered structure or a multi-layered structure. Subsequently, a first passivation layer 28 is formed on the dielectric layer 24. In addition, the first passivation layer 28 covers the drain electrode D, the source electrode S, the dielectric layer 24 and the first protection film 25 (if the first protection film 25 exists). The first passivation layer 28 has a third contact hole TH3 at least partially exposing the drain electrode D. The material of the first passivation layer 28 may include organic insulating material or inorganic insulating material, and the first passivation layer 28 may be a single-layered structure or a multi-layered structure.

Figure 6:
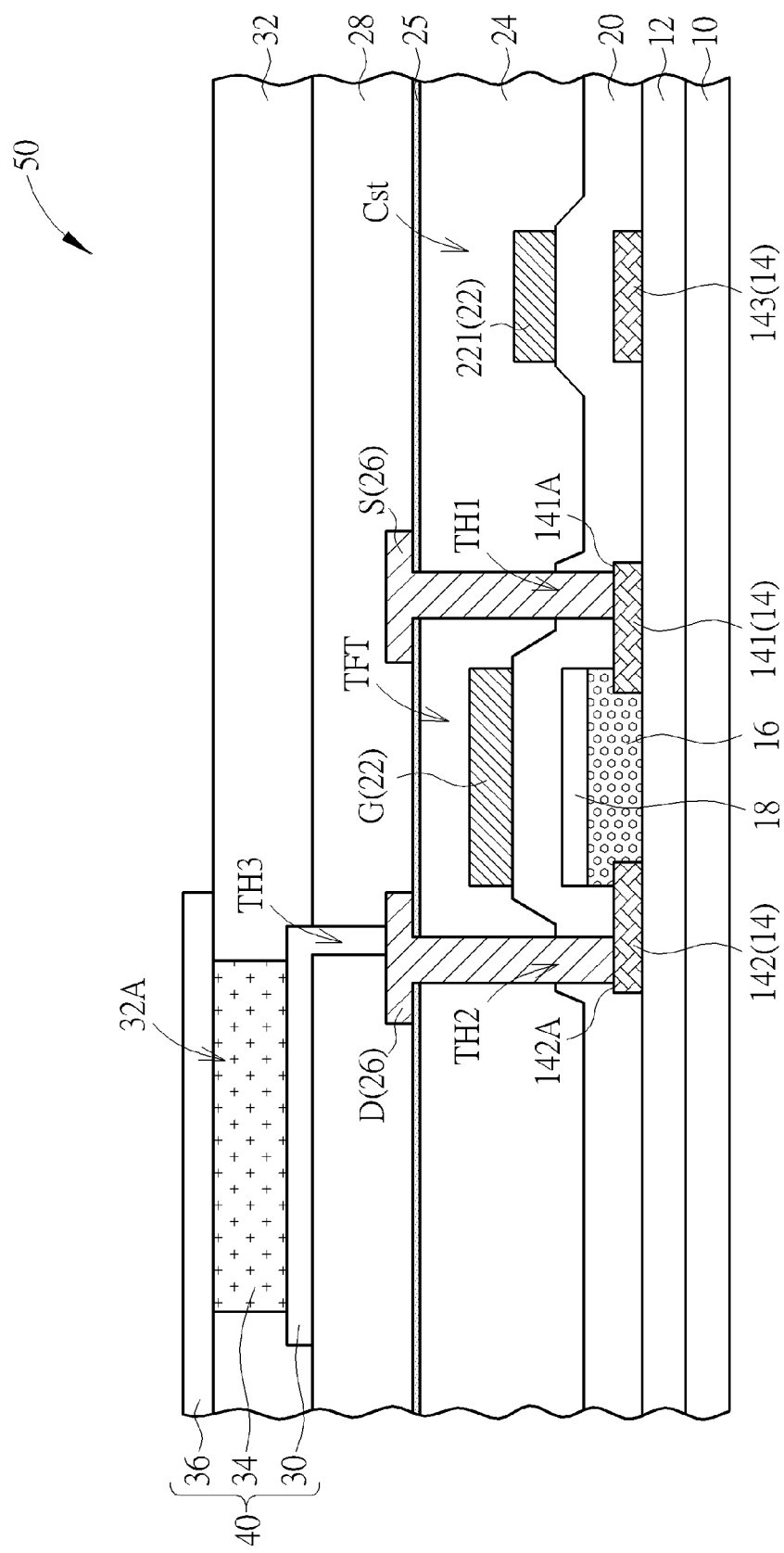

As shown in FIG. 6, a first pixel electrode 30 is formed on a portion of the first passivation layer 28 to form a pixel structure 50 of this embodiment. The first pixel electrode 30 is electrically connected to the drain electrode D of the thin film transistor device TFT through the third contact hole TH3. In this embodiment, the pixel structure 50 is applied in an organic electroluminescent display panel, and thus the method may further include the following steps. A second passivation layer (or namely bank, or namely wall) 32 is formed on the first passivation layer 28. The second passivation layer 32 has an opening 32A at least partially exposing the first pixel electrode 30. The material of the second passivation layer 32 may include organic insulating material or inorganic insulating material, and the second passivation layer 32 may be a single-layered structure or a multi-layered structure. Then, a display medium layer 34 is formed in the opening 32A of the second passivation layer 32. In this embodiment, the display medium layer 34 is an organic light-emitting layer. Subsequently, a second pixel electrode 36 is formed on the display medium layer 34, wherein the second pixel electrode 36 further covers a portion of the second passivation layer 32. The first pixel electrode 30 and the second pixel electrode 36 may be, for instance, an anode and a cathode respectively, and the first pixel electrode 30, the display medium layer 34 and the second pixel electrode 36 form a display device 40, which is an organic electroluminescent device e.g. an organic light-emitting diode (OLED) or organic electroluminescent (OELD) device. One of the first pixel electrode 30 and the second pixel electrode 36 is a transparent electrode (namely light transmission electrode), and the other is a reflection electrode or a transparent electrode. For example, if the display device 40 is a top emission display device, the first pixel electrode 30 is a reflection electrode and the second pixel electrode 36 is a transparent electrode; if the display device 40 is a bottom emission display device, the first pixel electrode 30 is a transparent electrode and the second pixel electrode 36 is a reflection electrode; if the display device 40 is a dual-sided emission display device, the first pixel electrode 30 and the second pixel electrode 36 are both transparent electrodes. In addition, other layers e.g. hole injection layer, hole transmission layer, electron injection layer and electron transmission layer may be optionally inserted between the first pixel electrode 30 and the second pixel electrode 36.

The pixel structure 50 is not limited to be applied in organic electroluminescent display device, and may be applicable for various types of self-luminous display panels or non-self-luminous display panels such as LCD panels, electrophoretic display panels and electrowetting display panels. When another type of display panel is selected, the display medium layer 34 may be switched to a corresponding solid or liquid display medium layer e.g. a liquid crystal layer, an electrophoretic layer or a hydrophilic/hydrophobic mixing solution. When the material of the display medium layer 34 is a non-self-luminous material or another type of self-luminous material, at least one of the second passivation layer 32 and the second pixel electrode 36 may be optionally omitted.

The method of fabricating pixel structure of this embodiment has the following advantages:

1. The source electrode S and the drain electrode D are electrically connected to the oxide semiconductor channel layer 16 through the first connection electrode 141 and the second connection electrode 142 respectively without directly contacting the oxide semiconductor channel layer 16, and therefore the material having better contact with the oxide semiconductor channel layer 16 may be selected to form the first connection electrode 141 and the second connection electrode 142 to improve the electron mobility of the thin film transistor device TFT.

2. The source electrode S and the drain electrode D are electrically connected to the oxide semiconductor channel layer 16 through the first connection electrode 141 and the second connection electrode 142, and thus the device characteristic of the thin film transistor device TFT is unaffected when the source electrode S and the drain electrode D are asymmetric with respect to the oxide semiconductor channel layer 16 due to the shift of the location of the first contact hole TH1 and the second contact hole TH2 which results from process bias.

3. The oxide semiconductor channel layer 16 is free from being damaged when etching the dielectric layer 24 and the gate insulation layer 20 because the first contact hole TH1 and the second contact hole TH2 expose the first connection electrode 141 and the second connection electrode 142, instead of the oxide semiconductor channel layer 16; the selection of the material of the dielectric layer 24 is not limited to the etching selectivity between the material of the dielectric layer 24 and that of the oxide semiconductor channel layer 16.

4. The method of the present disclosure uses three different patterned conductive layers including the first patterned conductive layer 14, the second patterned conductive layer 22 and the third patterned conductive layer 26, and therefore is more flexible in designing compared with a conventional method which uses only two different patterned conductive layers.

5. The storage capacitor device Cst is formed by the first patterned conductive layer 14 and the second patterned conductive layer 22, which increases the storage capacitance.

The pixel structure and fabrication thereof are not limited by the aforementioned embodiment, and may have other different preferred embodiments. To simplify the description, the identical components in each of the following embodiments are marked with identical symbols. For making it easier to compare the difference between the embodiments, the following description will detail the dissimilarities among different embodiments and the identical features will not be redundantly described.

Figure 7:
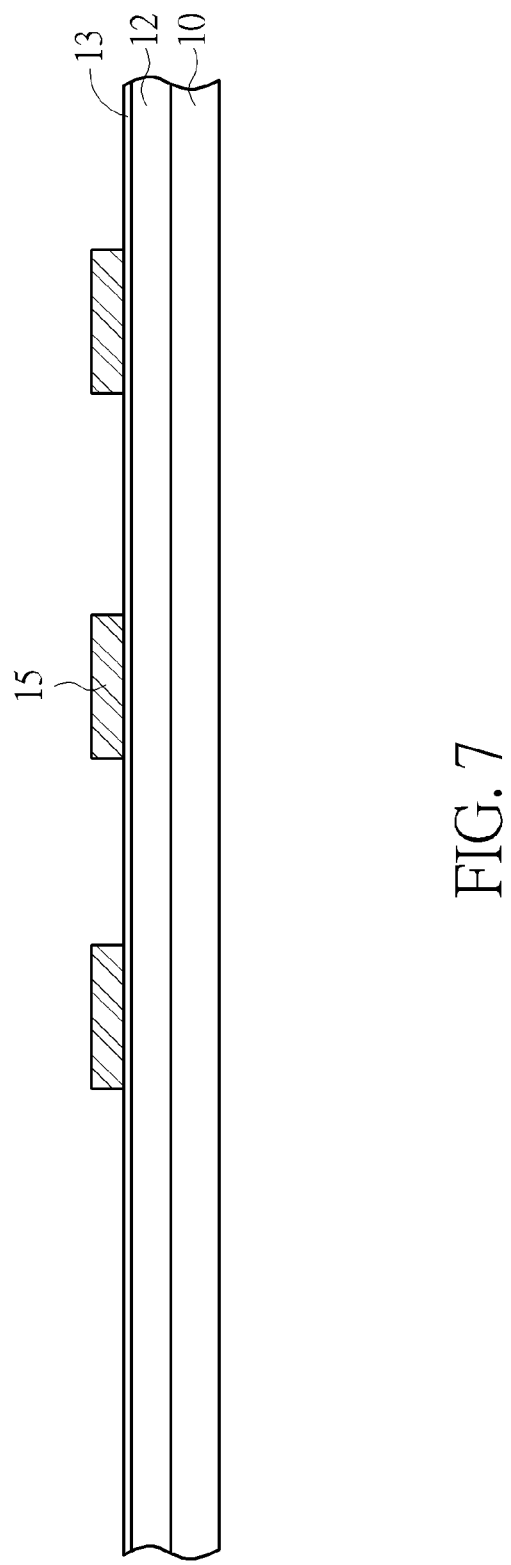
FIGS. 7-9 are schematic diagrams illustrating a method of fabricating pixel structure according to a second embodiment of the present disclosure.
Figure 8:
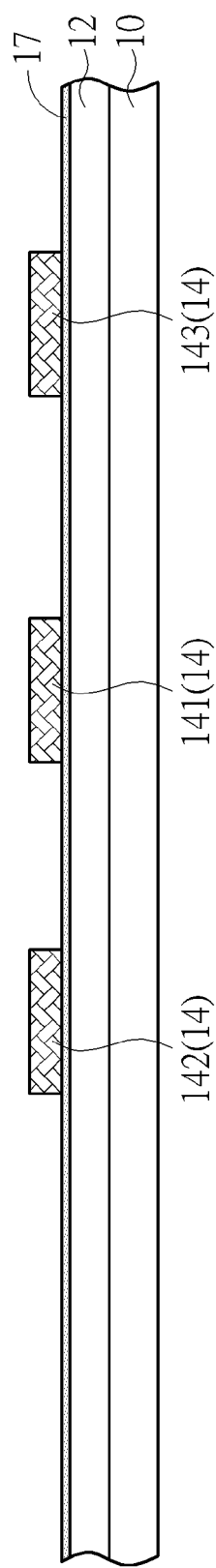
Figure 9:
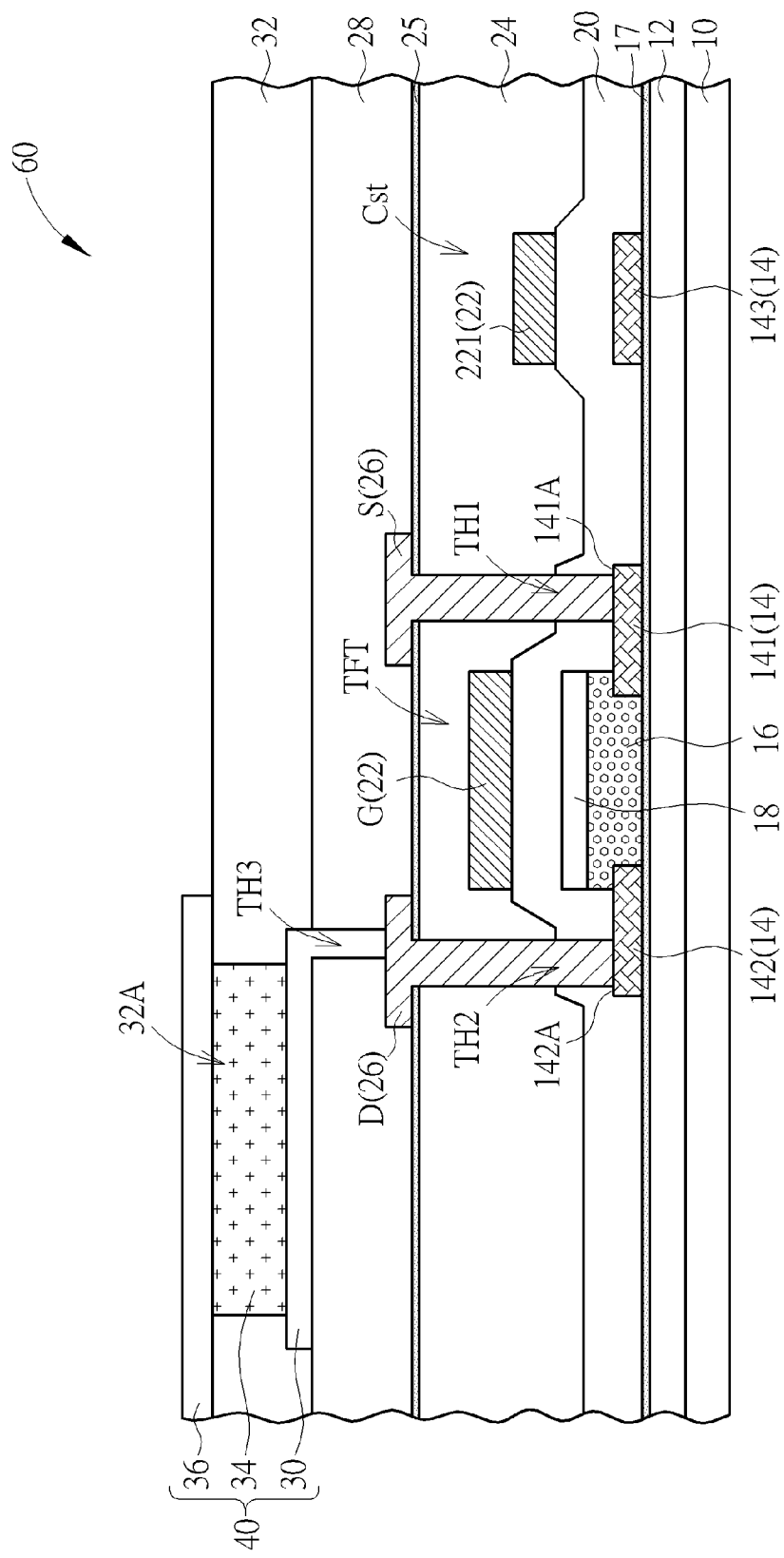

Refer to FIGS. 7-9. FIGS. 7-9 are schematic diagrams illustrating a method of fabricating pixel structure according to a second embodiment of the present disclosure. In this embodiment, the first patterned conductive layer 14 is a metal oxide conductive layer, which is different from the first embodiment, and other steps are similar to that of the first embodiment and referred to the first embodiment. The following description is focused on the formation of the first patterned conductive layer 14. As shown in FIG. 7, a metal layer 13 is formed on the substrate 10 or on the buffer layer 12 (if the buffer layer 12 exists). Then, a patterned metal oxide semiconductor layer 15 is formed on the metal layer 13, wherein the bottom surface of the patterned metal oxide semiconductor layer 15 is in contact with the top surface of the metal layer 13. In this embodiment, the material of the metal layer 13 may include aluminum, but not limited thereto. The material of the patterned metal oxide semiconductor layer 15 may include indium gallium zinc oxide (IGZO) or other suitable oxide semiconductor materials.

As shown in FIG. 8, the metal layer 13 is oxidized. Specifically, the metal layer 13 is reacted with the oxygen atoms of the patterned metal oxide semiconductor layer 15 to form a metal oxide layer. Meanwhile, the oxygen content of the patterned metal oxide semiconductor layer 15 is reduced and thus converted into a metal oxide conductive layer. The metal oxide layer becomes a second protective film 17 to prevent the impurities in the substrate 10 and the buffer layer 12 from diffusing, and the metal oxide conductive layer becomes the first patterned conductive layer 14, which includes the first connection electrode 141, the second connection electrode 142 and the storage capacitor bottom electrode 143. For example, in an embodiment, the material of the metal layer 13 is aluminum and the material of the patterned metal oxide semiconductor layer 15 is IGZO. Prior to the oxidization, the resistance of aluminum is about 85Ω/□ (85 Ω/square) and the resistance of IGZO is about $10^8$Ω/□($10^8$ Ω/square); subsequent to the oxidization, aluminum is converted into aluminum oxide having a resistance of about $2\times10^4$Ω/□ ($2\times10^4$ Ω/square) and the resistance of IGZO is lowered to about 100Ω/□ (100 Ω/square).

As shown in FIG. 9, successive processes are performed as disclosed in the aforementioned embodiment (such as the first embodiment) to fabricate a pixel structure 60 of this embodiment.

Figure 10:
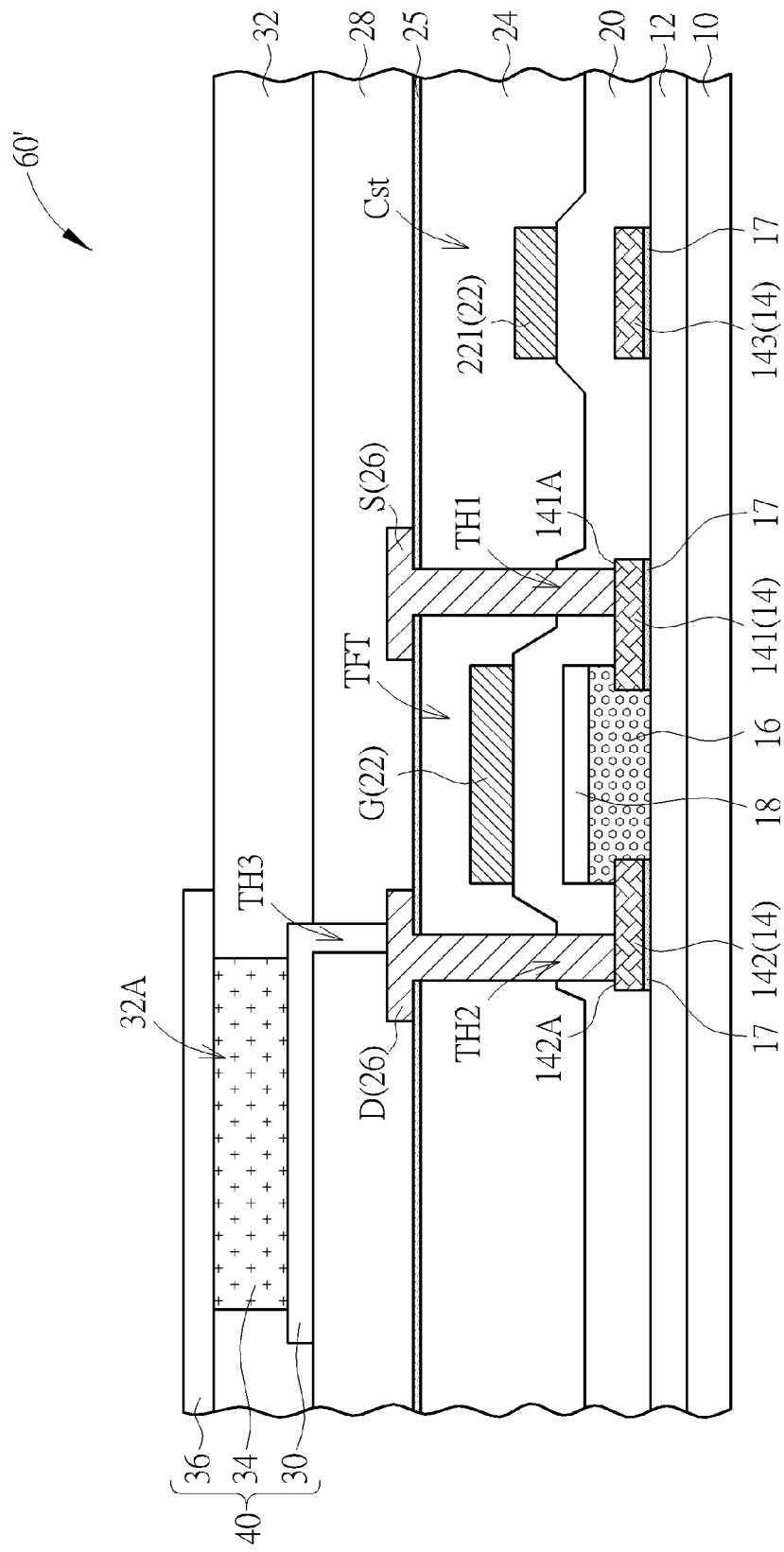
FIG. 10 is a schematic diagram illustrating a method of fabricating pixel structure according to an alternative embodiment of the second embodiment of the present disclosure.

Refer to FIG. 10. FIG. 10 is a schematic diagram illustrating a method of fabricating pixel structure according to an alternative embodiment of the second embodiment of the present disclosure. As shown in FIG. 10, in this alternative embodiment, after the oxidization, the second protective film 17 exposed by the first patterned conductive layer 14 is removed, and the second protective film 17 covered by the first patterned conductive layer 14 is reserved (or namely retained, or namely remained). This avoids short-circuited issue due to incomplete oxidization of the second protective film 17. Then, successive processes are performed as disclosed in the aforementioned embodiment (such as the first embodiment) to fabricate a pixel structure 60' of this embodiment.

Figure 11:
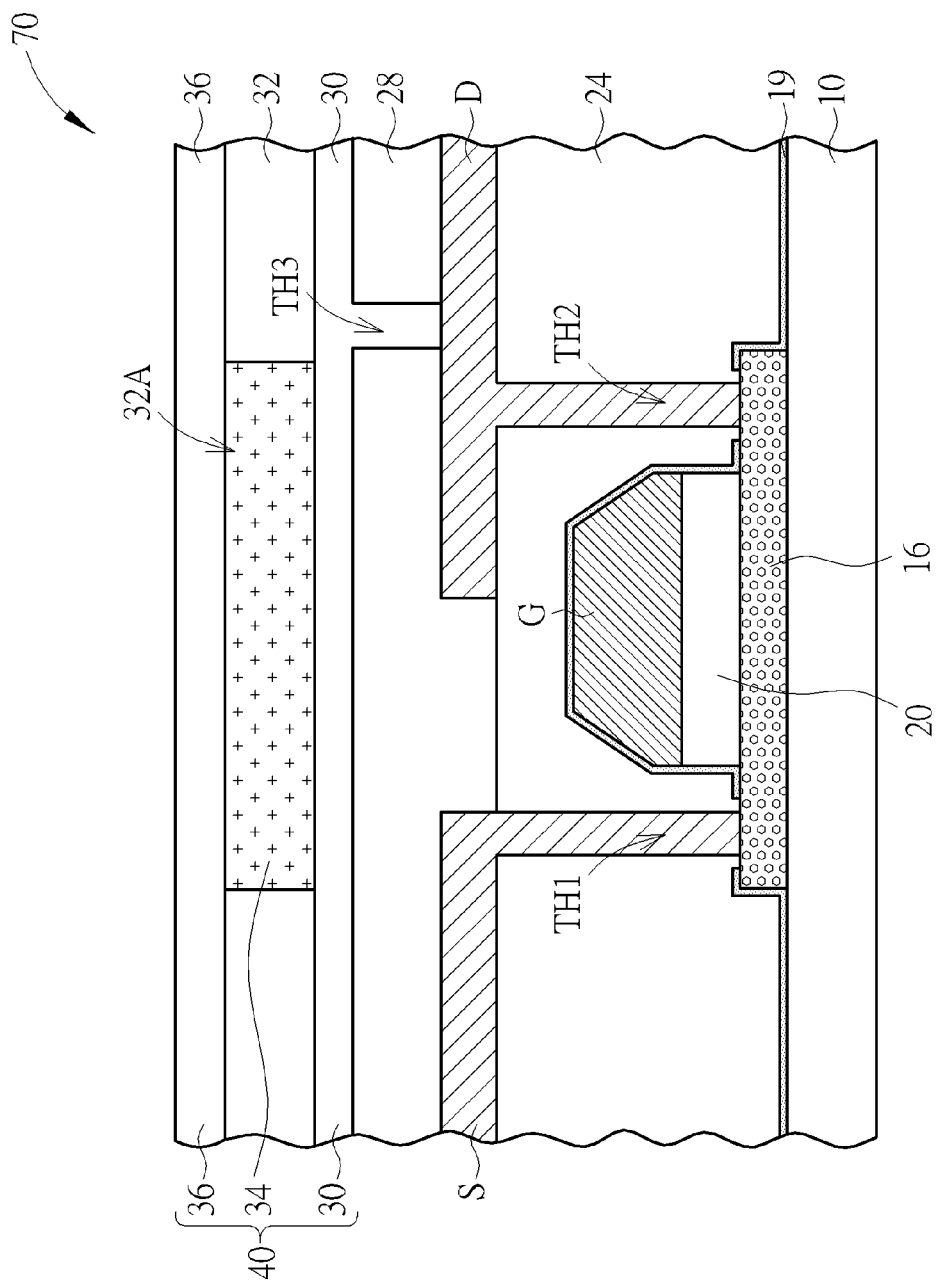
FIG. 11 is a schematic diagram illustrating a pixel structure according to a comparative embodiment of the present disclosure.

Refer to FIG. 11. FIG. 11 is a schematic diagram illustrating a pixel structure according to a comparative embodiment of the present disclosure. As shown in FIG. 11, in the pixel structure 70 of this comparative embodiment, the first contact hole TH1 and the second contact hole TH2 directly expose the top surface of the oxide semiconductor channel layer 16, and the source electrode S and the drain electrode D are in directly contact with the oxide semiconductor channel layer 16 via the first contact hole TH1 and the second contact hole TH2. Wherein the oxide semiconductor channel layer 16 is directly contacted with substrate 10, the protection film 19 is directly contacted and covers the gate electrode G, substrate 10 and a portion of oxide semiconductor channel layer 16, and the gate insulation layer 20 is only located on the oxide semiconductor channel layer 16 and does not exist in other portions. The pixel structure 70 of this comparative embodiment is suffered from the following drawbacks.

1. There is a poor contact between the source electrode S/the drain electrode D and the oxide semiconductor channel layer 16.

2. The oxide semiconductor channel layer 16 is transparent and made of the first patterned layer, which increases the alignment difficulty for successive processes.

3. The formation of the first contact hole TH1 and the second contact hole TH2 in the dielectric layer 24 and the protection film 19 cannot be carried out by a dry etching process which would damage the oxide semiconductor channel layer 16; the material of the dielectric layer 24 is limited when a wet etching process is adopted, for example, the material that can be etched by hydrofluoric acid cannot be used.

4. The storage capacitor bottom electrode (not shown) and the oxide semiconductor channel layer 16 are formed by the same patterned layer, and thus the storage capacitor bottom electrode must be supplied with a constant voltage to be maintained in an inversed state to provide enough storage capacitance.

5. There is only the gate insulation layer 20 between the gate electrode G and the oxide semiconductor channel layer 16, and thus the capacitance of the thin film transistor device and the storage capacitance of the storage capacitor device cannot be tuned independently, which makes it difficult to fabricate a thin film transistor device with specific device characteristic and a storage capacitor with high storage capacitance at the same time.

6. The source electrode S and the drain electrode D are asymmetric with respect to the oxide semiconductor channel layer 16 due to the shift of the location of the first contact hole TH1 and the second contact hole TH2 resulting from process bias, which severely affects the device characteristic of the thin film transistor device.

Figure 12:
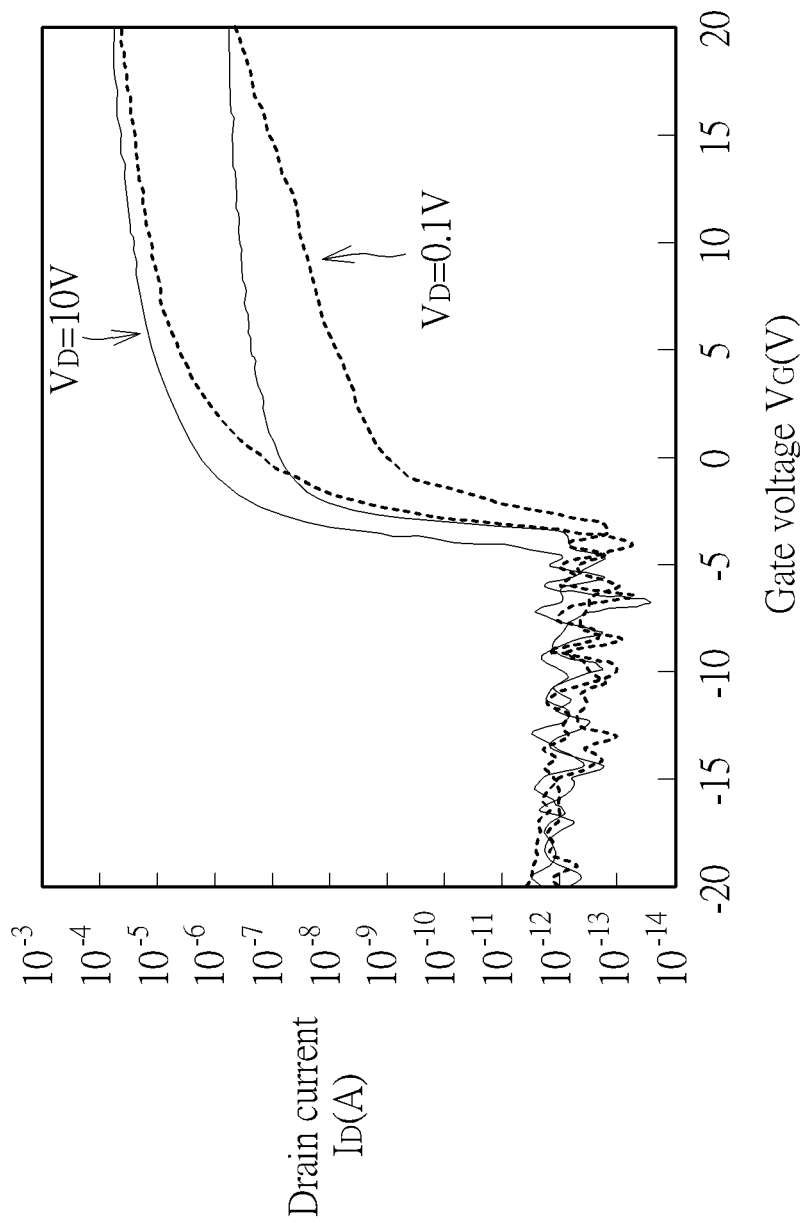
FIG. 12 schematically illustrates the relation between gate voltage $V_G$ and drain current $I_D$ of the thin film transistor device of the pixel structure of the comparative embodiment.
Figure 13:
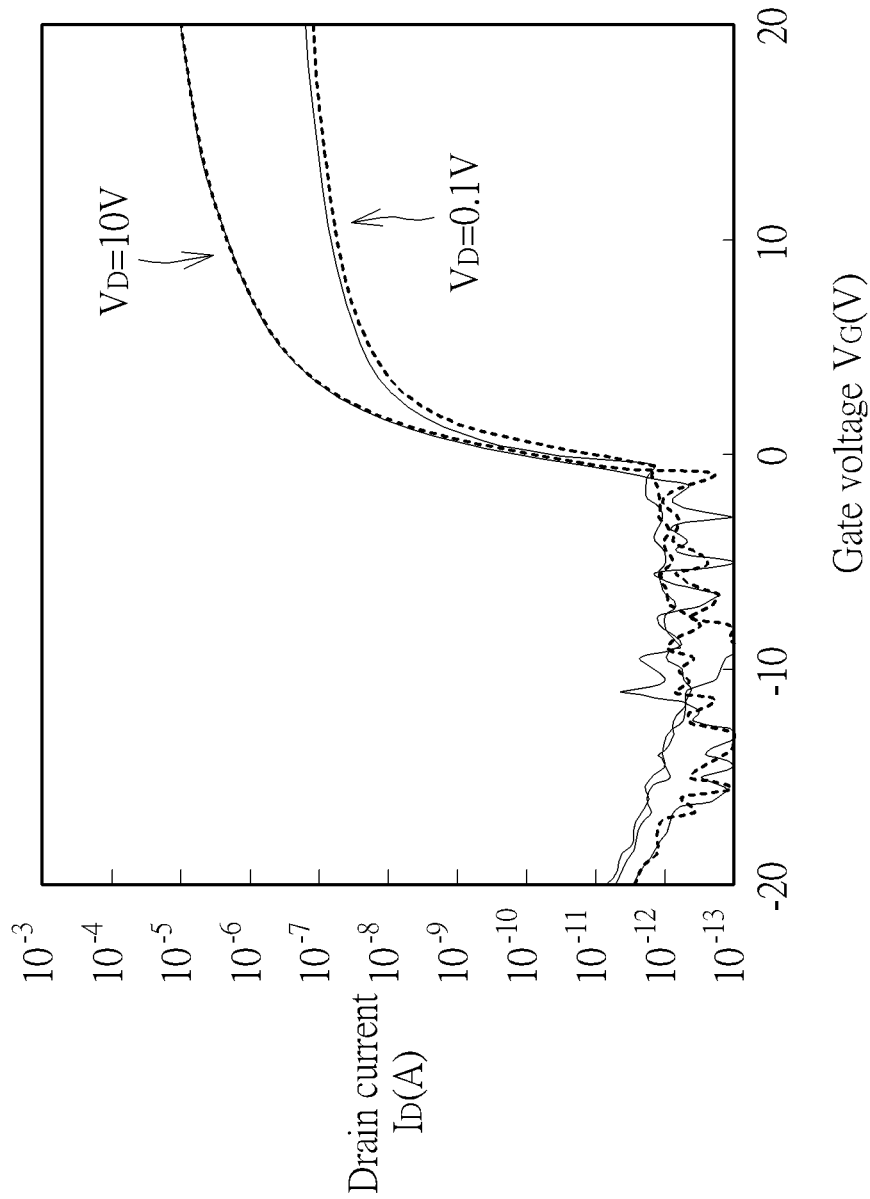
FIG. 13 schematically illustrates the relation between gate voltage $V_G$ and drain current $I_D$ of the thin film transistor device of the pixel structure of the present disclosure.

Refer to FIG. 12 and FIG. 13. FIG. 12 schematically illustrates the relation between gate voltage $V_G$ and drain current $I_D$ of the thin film transistor device of the pixel structure of the comparative embodiment, and FIG. 13 schematically illustrates the relation between gate voltage $V_G$ and drain current $I_D$ of the thin film transistor device of the pixel structure of the present disclosure, where the solid curve is measured from the source electrode S and the dotted curve is measured from the drain electrode D. As shown in FIG. 12, at different values of gate voltage $V_G$ (e.g. $V_G$=10V or $V_G$=0.1V), the relations between gate voltage $V_G$ and drain current $I_D$ are significantly diverse. Under identical drain voltage $V_D$, the drain current $I_D$ measured from the source electrode S and the drain current $I_D$ measured from the drain electrode D are also significantly different. This result evidently shows that the asymmetry of the thin film transistor device of the comparative embodiment causes an asymmetric device characteristic. As shown in FIG. 13, at different values of gate voltage $V_G$ (e.g. $V_G$=10V or $V_G$=0.1V), the relations between gate voltage $V_G$ and drain current $I_D$ are nearly identical. Under identical drain voltage $V_D$, the drain current $I_D$ measured from the source electrode S and the drain current $I_D$ measured from the drain electrode D are also identical. This result evidently shows that the symmetry of the thin film transistor device of the present disclosure provides a symmetric device characteristic.

In conclusion, the pixel structure of the present disclosure uses connection electrodes to connect the source electrode/drain electrode and the oxide semiconductor channel layer, which avoids the defect of the direct contact between the source electrode/drain electrode and the oxide semiconductor channel layer. Thus, the device characteristic of the thin film transistor device is effectively improved.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. A pixel structure, comprising:
    a substrate;
    a thin film transistor device, disposed on the substrate, the thin film transistor device comprising:
        a first connection electrode and a second connection electrode, disposed on the substrate, wherein the first connection electrode and the second connection electrode comprise conductive materials respectively;

an oxide semiconductor channel layer, disposed on the substrate, wherein the oxide semiconductor channel layer has two opposite sides partially overlapping a top surface of the first connection electrode and a top surface of the second connection electrode respectively, and the first connection electrode and the second connection electrode are disposed between the oxide semiconductor channel layer and the substrate;

a gate insulation layer, disposed on the substrate and covering the oxide semiconductor channel layer, the first connection electrode and the second connection electrode;

a gate electrode, disposed on the gate insulation layer;

a dielectric layer, disposed on the gate electrode and the gate insulation layer, wherein the gate insulation layer and the dielectric layer have a first contact hole at least partially exposing the top surface of the first connection electrode, and a second contact hole at least partially exposing the top surface of the second connection electrode; and a source electrode and a drain electrode, disposed on the dielectric layer, wherein the source electrode is electrically connected to the first connection electrode through the first contact hole so as to form an entire source electrode by the source electrode and the first connection electrode, and the drain electrode is electrically connected to the second connection electrode through the second contact hole so as to form an entire drain electrode by the drain electrode and the second connection electrode;

a first passivation layer, disposed on the dielectric layer, wherein the first passivation layer has a third contact hole at least partially exposing the drain electrode; and a first pixel electrode, disposed on the first passivation layer, wherein the first pixel electrode is electrically connected to the drain electrode of the thin film transistor device through the third contact hole.

2. The pixel structure of claim 1, wherein the first connection electrode and the second connection electrode comprise metal electrodes.

3. The pixel structure of claim 1, wherein the first connection electrode and the second connection electrode comprise metal oxide conductive electrodes.

4. The pixel structure of claim 1, wherein the thin film transistor device further comprises a protection pattern disposed between the oxide semiconductor channel layer and the gate insulation layer, and the protection pattern comprises an insulating material.

5. The pixel structure of claim 1, further comprising:
a display medium layer, disposed on the first pixel electrode; and
a second pixel electrode, disposed on the display medium layer.

6. The pixel structure of claim 5, wherein the display medium layer is an organic electroluminescent layer.

7. The pixel structure of claim 5, further comprising a second passivation layer disposed on the first passivation layer, wherein the second passivation layer has an opening at least partially exposing the first pixel electrode, and the display medium layer is disposed in the opening of the second passivation layer.

8. The pixel structure of claim 1, further comprising a storage capacitor device, wherein the storage capacitor device comprises:
a storage capacitor bottom electrode, disposed on the substrate; and a storage capacitor top electrode, disposed on the gate insulation layer.

9. The pixel structure of claim 8, wherein the storage capacitor bottom electrode, the first connection electrode and the second connection electrode are made of a first patterned conductive layer, and the storage capacitor top electrode and the gate electrode are made of a second patterned conductive layer.

10. The pixel structure of claim 1, further comprising a first protection film disposed between the dielectric layer and the first passivation layer.

11. The pixel structure of claim 1, further comprising a second protection film disposed between the substrate and the first connection electrode, and between the substrate and the second connection electrode.

12. A method of fabricating pixel structure, comprising:
providing a substrate;
forming a first patterned conductive layer on the substrate, wherein the first patterned conductive layer comprises a first connection electrode and a second connection electrode, and the first connection electrode and the second connection electrode comprise conductive materials respectively;
forming an oxide semiconductor channel layer on the substrate, wherein the oxide semiconductor channel layer has two opposite sides partially overlapping a top surface of the first connection electrode and a top surface of the second connection electrode respectively, and the first connection electrode and the second connection electrode are disposed between the oxide semiconductor channel layer and the substrate;
forming a gate insulation layer on the substrate, wherein the gate insulation layer covers the oxide semiconductor channel layer, the first connection electrode and the second connection electrode;
forming a second patterned conductive layer on the gate insulation layer, wherein the second patterned conductive layer comprises a gate electrode;
forming a dielectric layer on the gate electrode and the gate insulation layer;
forming a first contact hole in the gate insulation layer and the dielectric layer to at least partially expose the top surface of the first connection electrode, and a second contact hole in the gate insulation layer and the dielectric layer to at least partially expose the top surface of the second connection electrode;
forming a third patterned conductive layer on the dielectric layer, wherein the third patterned conductive layer comprises a source electrode and a drain electrode, the source electrode is electrically connected to the first connection electrode through the first contact hole so as to form a complete source electrode, and the drain electrode is electrically connected to the second connection electrode through the second contact hole so as to form a complete drain electrode;
forming a first passivation layer on the dielectric layer, wherein the first passivation layer has a third contact hole at least partially exposing the drain electrode; and
forming a first pixel electrode on the first passivation layer, wherein the first pixel electrode is electrically connected to the drain electrode of the thin film transistor device through the third contact hole.

13. The method of fabricating pixel structure of claim 12, further comprising:

forming a second passivation layer on the first passivation layer, wherein the second passivation layer has an opening at least partially exposing the first pixel electrode;

forming a display medium layer in the opening of the second passivation layer; and forming a second pixel electrode on the display medium layer.

14. The method of fabricating pixel structure of claim 13, wherein the display medium layer is an organic electroluminescent layer.

15. The method of fabricating pixel structure of claim 12, wherein the first patterned conductive layer further comprises a storage capacitor bottom electrode, and the second patterned conductive layer further comprises a storage capacitor top electrode.

16. The method of fabricating pixel structure of claim 12, wherein the first patterned conductive layer comprises a metal layer.

17. The method of fabricating pixel structure of claim 12, wherein the first patterned conductive layer comprises a metal oxide conductive layer.

18. The method of fabricating pixel structure of claim 17, wherein forming the metal oxide conductive layer comprises:

forming a metal layer on the substrate;

forming a patterned metal oxide semiconductor layer on the metal layer, wherein the patterned metal oxide semiconductor layer is in contact with the metal layer; and oxidizing the metal layer to convert the patterned metal oxide semiconductor layer into the metal oxide conductive layer.

* * * * *